US012757322B2

(12) United States Patent
Li et al.

(10) Patent No.: US 12,757,322 B2
(45) Date of Patent: Oct. 6, 2026

(54) CIRCUIT BOARD AND ELECTRONIC DEVICE

(71) Applicant: Shenzhen Jufei Optoelectronics Co., Ltd., Shenzhen (CN)

(72) Inventors: Mingquan Li, Shenzhen (CN); Wenqin Xu, Shenzhen (CN); Pingru Sun, Shenzhen (CN)

(73) Assignee: Shenzhen Jufei Optoelectronics Co., Ltd., Shenzhen (CN)

( * ) Notice: Subject to any disclaimer, the term of this patent is extended or adjusted under 35 U.S.C. 154(b) by 392 days.

(21) Appl. No.: 18/561,288

(22) PCT Filed: May 20, 2022

(86) PCT No.: PCT/CN2022/094166
§ 371 (c)(1),
(2) Date: Nov. 15, 2023

(87) PCT Pub. No.: WO2022/242754
PCT Pub. Date: Nov. 24, 2022

(65) Prior Publication Data

US 2024/0251503 A1 Jul. 25, 2024

(30) Foreign Application Priority Data

May 20, 2021 (CN) ......................... 202121096883.2

(51) Int. Cl.
*H05K 1/02* (2006.01)
*H05K 1/11* (2006.01)
(Continued)

(52) U.S. Cl.
CPC ........... *H05K 1/0296* (2013.01); *H05K 1/111* (2013.01); *H05K 1/114* (2013.01); *H10H 20/857* (2025.01);
(Continued)

(58) Field of Classification Search
CPC .................................................... H10H 20/857
See application file for complete search history.

(56) References Cited

U.S. PATENT DOCUMENTS 9,082,808 B2 * 7/2015 Thacker .............. H01L 25/0652
2011/0096045 A1 * 4/2011 Ito ............................ G09F 9/33
257/E33.056
(Continued)

FOREIGN PATENT DOCUMENTS

KR 20110080952 A * 7/2011 ........... H10H 20/857

OTHER PUBLICATIONS

KR-20110080952-A Translation (Year: 2026).*

*Primary Examiner* — Timothy J Thompson
*Assistant Examiner* — John B Freal

(57) ABSTRACT

The present application relates to a circuit board and an electronic device. The first slit is used to divide the metal layer on the substrate into at least two first regions and second regions that are alternately distributed and mutually insulated in a row direction and a column direction; the second slit in each row direction of the first regions is interrupted by the first extension portion of at least a portion of the metal sheets within the first regions along the column direction; the second slit in each column direction of the second regions is interrupted by the second extension portion of at least a portion of the metal sheets within the second regions along the row direction.

15 Claims, 6 Drawing Sheets

(51) Int. Cl.
*H05K 1/181* (2026.01)
*H10H 20/857* (2025.01)
*H10W 90/00* (2026.01)

(52) U.S. Cl.
CPC ............ *H10W 90/00* (2026.01); *H05K 1/181* (2013.01); *H05K 2201/09409* (2013.01); *H05K 2201/10106* (2013.01)

(56) References Cited

U.S. PATENT DOCUMENTS

| | | | | |
|---|---|---|---|---|
| 2019/0280163 | A1* | 9/2019 | Li | H01L 25/0753 |
| 2020/0243598 | A1* | 7/2020 | Chiu | H10H 20/819 |

* cited by examiner

CIRCUIT BOARD AND ELECTRONIC DEVICE

TECHNICAL FIELD

The present application relates to the technical field of chip packaging, and in particular to a circuit board and an electronic device.

BACKGROUND

Surface Mounted Technology (SMT) is the most popular technology and process in the electronic assembly industry. It is a circuit assembly and connection technology that involves the installation of surface-mounted components (abbreviated as SMC/SMD, which stands for Surface Mounted Components/Surface Mounted Devices) with no pins or short leads onto the surface of a Printed Circuit Board (PCB) or other substrates. These components are then soldered and assembled through methods such as reflow soldering or dip soldering. With the development of miniaturization in electronic devices, SMT is increasingly being widely used in the manufacturing of electronic devices.

A steel stencil is a specialized die used in surface mounted technology, and the main function thereof is to facilitate the deposition of solder paste with the objective of transferring the correct amount of solder paste onto the corresponding solder pads on a printed circuit board. For the current printed circuit board structures, there are typically slits formed on the metal layer of the substrate to divide the metal layer into multiple mutually insulated metal sheets, thus forming the respective circuits. Solder pads and a solder resist ink layer (with the solder pads exposed) covering the circuits are provided at corresponding positions along these circuits. Specifically, the printed circuit board shown in FIG. 1 has slits C1 extending horizontally and slits C2 extending vertically formed thereon. The vertically extending slits C2 continuously span multiple metal sheets vertically, creating longer slits in the vertical direction. During the solder printing process on the printed circuit board, after applying solder on the steel stencil, as the squeegee moves across the steel stencil and passes through the vertical slits C2, the steel stencil is susceptible to deformation and sinking to the substrate surface due to the lack of proper support. Excessive sinking degree of the steel stencil would lead to damage to the steel stencil. Once the steel stencil is damaged during the solder application process, the precision of the solder application cannot be guaranteed.

SUMMARY

Given the shortcomings of the prior art mentioned above, the purpose of the present application is to provide a circuit board and an electronic device that can reduce the sinking degree of the steel stencil during the solder paste printing process on the circuit board, thereby extending the service life of the steel stencil.

To achieve the objectives of the present application, the following technical solutions are provided:

Provided is a circuit board, comprising at least one substrate, and a metal layer provided on a front surface and/or a back surface of the substrate, wherein the metal layer is provided with a region array, the region array comprises at least two first regions and at least two second regions formed by division through a first slit, and the first regions and the second regions are alternately distributed and mutually insulated in both a row direction and a column direction of the region array;

each of the first regions and the second regions is provided with at least two mutually insulated metal sheets formed by division through a second slit, and the two adjacent metal sheets within each of the first regions and the second regions are correspondingly provided with solder pads for connecting with an electronic component; the solder pads within each of the first regions and the second regions are arranged in a multi-row and multi-column array on the substrate to form a solder pad array;

at least a portion of the metal sheets within each of the first regions are provided with a first extension portion that extends along a column direction of the solder pad array, and in each row direction of the solder pad array within each of the first regions, the second slit is interrupted by the first extension portion; at least a portion of the metal sheets within each of the second regions are provided with a second extension portion that extends along a row direction of the solder pad array, and in each column direction of the solder pad array within each of the second regions, the second slit is interrupted by the second extension portion.

Based on the same inventive concept, the present application further provides an electronic device, comprising electronic components and the circuit board according to claim 1, wherein the electronic components are provided on the circuit board and soldered to the corresponding solder pads.

Advantageous Effects

For the circuit board according to the present application, at least a portion of the metal sheets within each of the first regions are provided with a first extension portion that extends along the column direction of the solder pad array, and in each row direction of the solder pad array within each of the first regions, the second slit is interrupted by the first extension portion; at least a portion of the metal sheets within each of the second regions are provided with a second extension portion that extends along the row direction of the solder pad array, and in each column direction of the solder pad array within each of the second regions, the second slit is interrupted by the second extension portion.

The circuitry of the circuit board is formed: by using the first slit to divide the metal layer on the substrate into at least two first regions and second regions that are alternately distributed and mutually insulated in the row direction and the column direction, forming a region array; and by using the second slit to divide the metal layer within each of the first regions and second regions to form at least two mutually insulated metal sheets, and providing corresponding solder pads for connecting with an electronic component on adjacent metal sheets. This method of forming the circuitry is simple and efficient.

In addition, the solder pads within each of the first regions and the second regions are arranged in a multi-row and multi-column array on the substrate to form a solder pad array. At least a portion of the metal sheets within each of the first regions are provided with a first extension portion that extends along the column direction of the solder pad array. In each row direction of the solder pad array within each of the first regions, the second slit is interrupted by the first extension portion, such that the first extension portion forms a supporting point for the steel stencil in each row direction.

At least a portion of the metal sheets within each of the second regions are provided with a second extension portion that extends along the row direction of the solder pad array. In each column direction of the solder pad array within each of the second regions, the second slit is interrupted by the second extension portion, such that the second extension portion forms a supporting point for the steel stencil in each column direction. This design ensures that there are adequate supporting points in both the row and column directions of the solder pad array, thereby minimizing the extent of deformation of the steel stencil at the position of the second slit during the solder printing process, such as minimizing the sinking degree of the steel stencil at the position of the second slit, extending the service life of the steel stencil, improving the precision of solder application, and reducing steel stencil wear and costs. Moreover, the present application only requires clever improvements to the distribution of the second slit, without the need for additional components or processes, making it simple to manufacture, highly versatile, and cost-effective.

The electronic device according to the present application employs the circuit board mentioned above. The distribution of the second slits on the circuit board can reduce the extent of deformation of the steel stencil at the positions of the second slits during the solder printing process. This best avoids damage to the steel stencil due to excessive extent of sinking at the positions of the second slits, thus ensuring the precision of the solder printed by the steel stencil and enhancing the reliability and yield of the circuit board and electronic device.

BRIEF DESCRIPTION OF THE DRAWINGS

In order to more clearly illustrate embodiments of the present application or the technical solutions in the prior art, the drawings required for use in the embodiments will be briefly described below. It is obvious that the drawings in the description below are only some embodiments of the present application, and other drawings can be derived from these drawings by those of ordinary skills in the art without making creative efforts.

DETAILED DESCRIPTION

For ease of understanding of the present application, the present application will be described more fully below with reference to the accompanying drawings. Preferred embodiments of the present application are given in the accompanying drawings. The present application can, however, be embodied in many different forms and should not be construed as limited to the embodiments set forth herein. Rather, these embodiments are provided such that the disclosure of the present application will be understood more thoroughly and completely.

Unless defined otherwise, all technical and scientific terms used herein have the same meaning as commonly understood by those skilled in the art to which the present application belongs. The terms used herein in the specification of the present application are for the purpose of describing specific embodiments only and are not intended to limit the present application.

The technical solutions in the embodiments of the present application will be clearly and completely described below with reference to the drawings in the embodiments of the present application. It is obvious that the described embodiments are only part of the embodiments of the present application, rather than all of the embodiments. All other embodiments obtained by those of ordinary skill in the art without making any creative effort on the basis of the embodiments of the present application shall fall within the protection scope of the present application.

Figure 1:
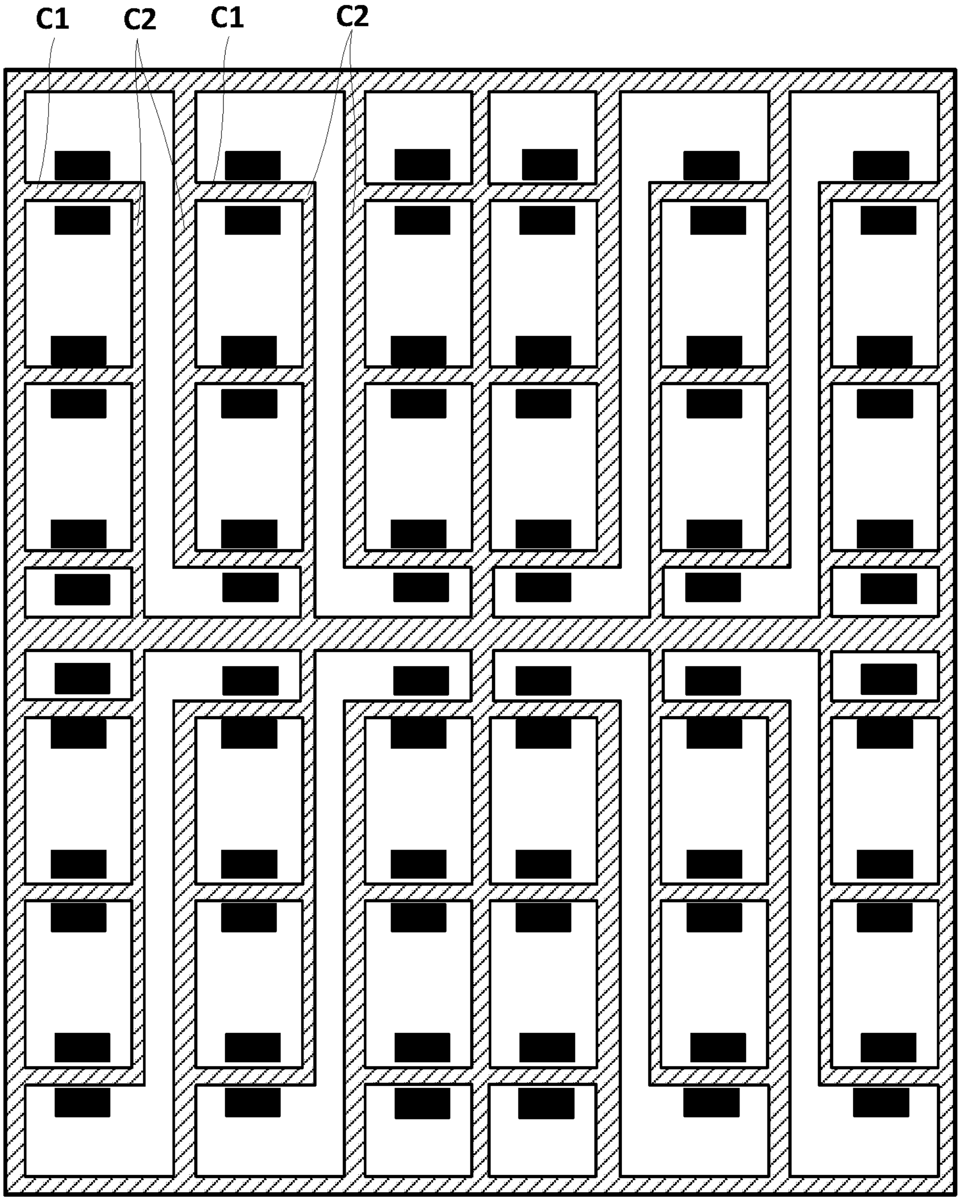
FIG. 1 is a schematic diagram of the structure of an existing printed circuit board.
Figure 2:
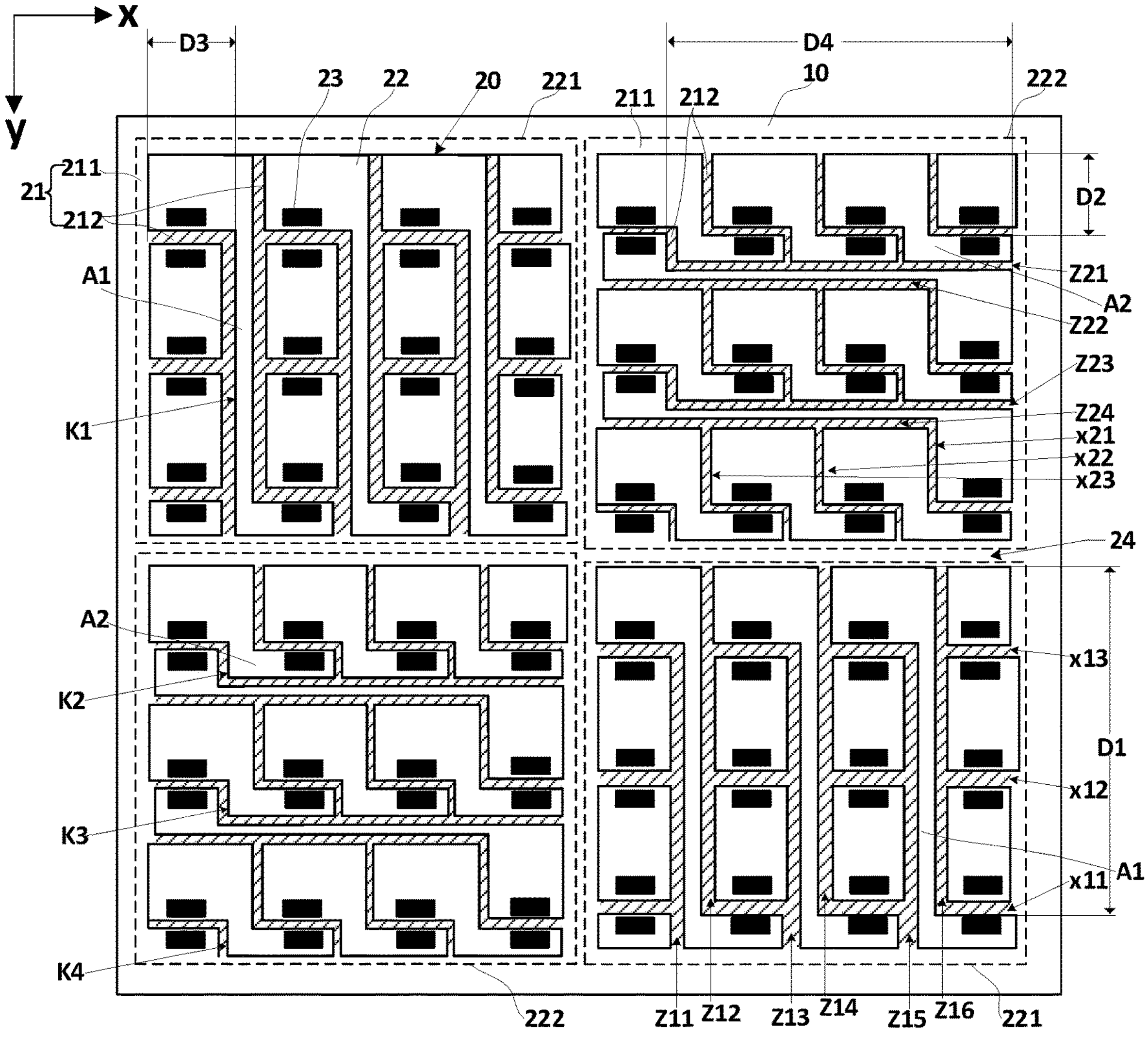
FIG. 2 is a top view I of the front surface of the circuit board according to the embodiment of the present application.
Figure 3:
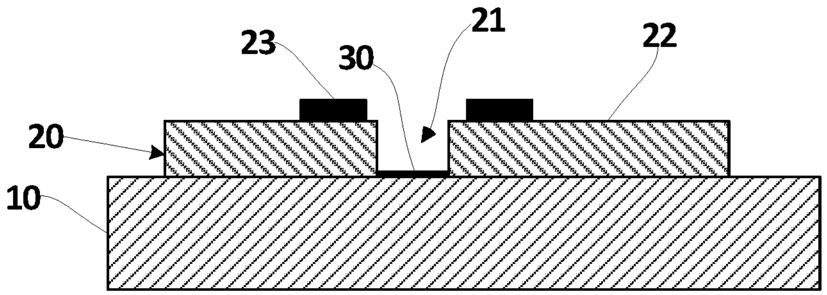
FIG. 3 is a cross-sectional schematic diagram I of the circuit board according to the embodiment of the present application.

A schematic diagram of a circuit board according to the embodiment can be referenced in FIGS. 2 and 3, where FIG. 2 is a top view of the front surface of the circuit board, and FIG. 3 is a cross-sectional schematic diagram of a portion including two adjacent metal sheets in FIG. 2. The circuit board according to the embodiment comprises a substrate 10 and a metal layer 20 provided on the substrate 10. As shown in FIGS. 2 and 3, the metal layer is provided on the front surface of the substrate. It should be understood that the metal layer 20 can also be provided on the back surface of the substrate 10 or provided on both the front and back surfaces of the substrate 10 simultaneously. To facilitate the understanding, the following explanation will focus on the case where the metal layer 20 is provided on the front surface of the substrate 10. The substrate 10 in the embodiment is an insulating substrate, and the material of the substrate 10 may be determined according to the usage scenario of the circuit board. For example, when the circuit board needs to be bent, the substrate 10 can be made of flexible materials such as epoxy resin, which offers good heat dissipation, is ultra-thin, and can be bent, folded, rolled, and moved and stretched freely in three-dimensional space, allowing for the formation of three-dimensional circuit boards. When the circuit board needs to provide some support, the substrate 10 can be made of rigid materials such as ceramic substrates to provide some mechanical strength for support.

In the embodiment, the metal layer 20 can be a conductive layer with conductivity properties, such as copper foil or aluminum foil, and slits 21 are formed on the metal layer 20. The slits 21 comprise a first slit 211 that divides the metal layer 20 into at least two first regions 221 and at least two second regions 222. The first slit 211 extends through the front and back surfaces of the metal layer 20 (i.e., the bottom of the first slit 211 is the surface of the substrate 10. It should be noted that FIG. 2 does not explicitly depict the first slit; the reference numeral 211 in FIG. 2 indicates the position where the first slit is formed). The formed at least two first regions 221 and at least two second regions 222 constitute an array of regions on the metal layer 20, as shown in FIG. 2. The first regions 221 and the second regions 222 are alternately distributed and mutually insulated in the row direction (X direction in FIG. 2, also referred to as the horizontal direction) and the column direction (Y direction in FIG. 2, also referred to as the vertical direction) of the region array. For example, in FIG. 2, the region array is a 2*2 array. In the first row of the region array, the first region 221 and the second region 222 are provided in sequence. In the second row of the region array, the second region 222 and the first region 221 are provided in sequence. In the first column of the region array, the first region 221 and the second region 222 are provided in sequence. In the second column of the region array, the second region 222 and the first region 221 are provided in sequence. The adjacent first region 221 and second region 222 are separated and insulated from each other by the first slit 21. It should be understood that the region array shown in FIG. 2 is just one example to facilitate the understanding. In practical applications, the region array can be configured as an N*M array, where both N and M are greater than or equal to 2, and the values of N and M can be equal or different.

Referring to FIG. 2, in the embodiment, the slits 21 further comprise a second slit 212 that divides the metal layer 20 within each of the first regions 221 and second regions 222 into at least two metal sheets 22. The second slit 212 also extends through the front and back surfaces of the metal layer 20 (i.e., the bottom of the second slit 212 is the surface of the substrate 10. The reference numeral 212 in FIG. 2 indicates the exemplary planar structure of the second slit.), enabling adjacent metal sheets 22 to be insulated from each other. Within each of the first regions 221 and second regions 222, two adjacent metal sheets 22 on each side of the second slit 212 are correspondingly provided with solder pads 23. For example, solder pads 23 can be respectively and correspondingly provided along the edges or in the regions near the edges of two adjacent metal sheets 22. The two corresponding solder pads 23 can respectively serve as a positive solder pad and a negative solder pad for connecting with the positive and negative pins of the same electronic component. As shown in FIG. 2, in the embodiment, the solder pads 23 within each of the first regions 221 and second regions 222 are combined to form a multi-row and multi-column array of solder pads on the substrate 10. In the example shown in FIG. 2, the solder pad array formed by the solder pads 23 in each of the first regions 221 and second regions 222 is a 12*8 array, which means there are 12 rows and 8 columns of solder pads. It should be understood that the solder pad array shown in FIG. 2 is also just one example to facilitate the understanding. In practical applications, the pad array can be configured as an n*m array, where both n and m are greater than or equal to 2, and the values of n and m can be equal or different.

As shown in FIG. 2, in the embodiment, at least a portion of the metal sheets 22 within each of the first regions 221 are provided with a first extension portion A1 that extends along the column direction of the solder pad array. In each row direction of the solder pad array within each of the first regions 221, the second slit 212 is interrupted by the first extension portion A1, such that the first extension portion A1 forms a supporting point for the steel stencil in each row direction. At least a portion of the metal sheets 22 within each of the second regions 222 are provided with a second extension portion A2 that extends along the row direction of the solder pad array. In each column direction of the solder pad array within each of the second regions 222, the second slit 212 is interrupted by the second extension portion A2, such that the second extension portion A2 forms a supporting point for the steel stencil in each column direction. This design ensures that there are adequate supporting points for the steel stencil in both the row and column directions of the solder pad array, thereby minimizing the extent of deformation of the steel stencil at the position of the second slit 212 during the solder printing process, extending the service life of the steel stencil, improving the precision of solder application, and reducing steel stencil wear and costs. Moreover, in the example shown in FIG. 2, it only requires clever adjustments to the distribution of the second slit 212, without the need for additional components or processes, making it simple to manufacture, highly versatile, and cost-effective.

In some examples of the embodiment, at least one of the first slit 211 and the second slit 212 can be formed by, but not limited to, etching the metal layer 20. The etching process is simple and well-established, with high efficiency and yields.

In some examples of the embodiment, the solder pads 23 provided at positions corresponding to the edges of two adjacent metal sheets 22 within each of the first regions 221 and second regions 222 may be provided symmetrically along the X-direction, such that the solder pads 23 are arranged in a multi-row and multi-column array. However, it should be understood that in the embodiment, the solder pads 23 correspondingly provided on two adjacent metal sheets 22 are not limited to a symmetrical arrangement and can be arranged asymmetrically according to requirements. In the embodiment, the number of solder pads 23 contained within each of the first regions 221 and second regions 222 is equal. Nevertheless, it should be understood that the number of solder pads 23 provided in each of the first regions 221 and second regions 222 may also be different.

In the embodiment, in the same column direction Y, due to the interruption of the second slit 212 within the second region 222 by the second extension portion A2 of the metal sheets 22 within the second region 222 along the row direction, the length D2 of a second slit 212 in the same column direction Y is less than the length D1 of a second slit 212 within the first region 221 in the same column direction Y (where D1 and D2 can be referred to FIG. 2, with the second slit 212 extending along the column direction within the first region 221 in FIG. 2 across multiple metal sheets 22). By providing a structure where in the same column direction Y, the length D1 of the second slit 212 within the first region 221 differs from the length D2 of the second slit 212 within the second region 222 (i.e., the second slit 212 provided in each column direction within the second region 222 is interrupted by the second extension portion A2 of the metal sheets 22 within the second region 222 along the row direction, while the second slit 212 within the first region 221 extends across multiple metal sheets 22), when using a steel stencil for solder printing, each second extension portion A2 serves as a supporting point, increasing the support strength of the steel stencil in the same straight-line direction in the column direction. Similarly, in the same row direction X, due to the interruption of the second slit 212 within the first region 221 by the first extension portion A1 of the metal sheets 22 within the first region 221 along the column direction, the length D3 of a second slit 212 in the same row direction X is less than the length D4 of a second slit 212 within the second region 222 in the same row direction X (where D3 and D4 can be referred to FIG. 2, with the second slit 212 extending along the row direction within the second region 222 in FIG. 2 across multiple metal sheets 22). By providing a structure where in the same row direction X, the length D3 of the second slit 212 within the first region 221 differs from the length D4 of the second slit 212 within the second region 222 (i.e., the second slit 212 provided in each row direction within the first region 221 is interrupted by the first extension portion A1 of the metal sheets 22 within the first region 221 along the column direction, while the second slit 212 within the second region 222 extends across multiple metal sheets 22), when using a steel stencil for solder printing, each first extension portion A1 serves as a supporting point, increasing the support strength of the steel stencil in the same straight-line direction in the row direction. This design reduces the sinking degree of the steel stencil during the solder printing process in both the row and column directions, extending the service life of the steel stencil.

Figure 6:
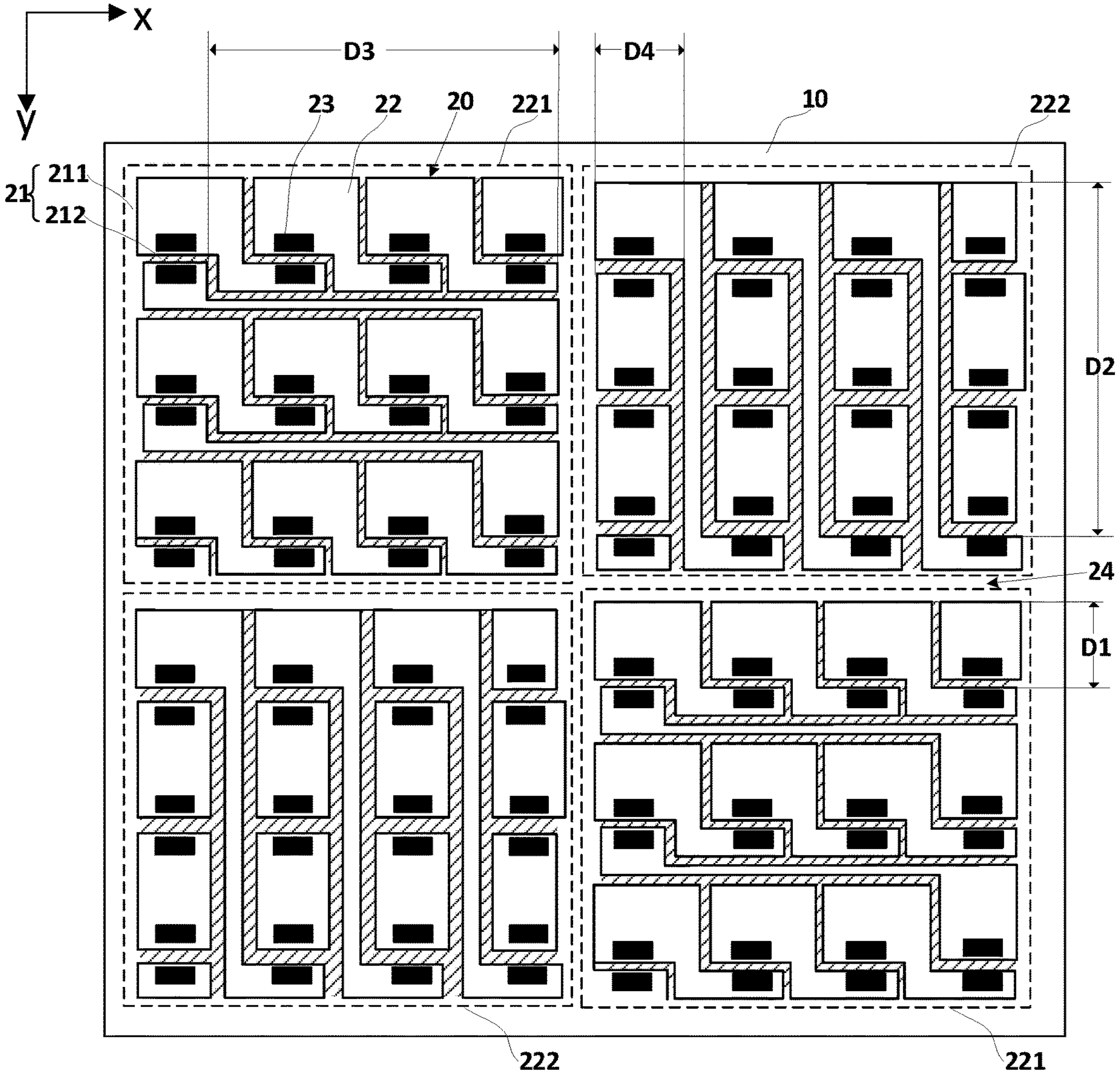
FIG. 6 is a top view II of the front surface of the circuit board according to the embodiment of the present application.

It can be understood that in other embodiments, the length D1 of the second slit 212 within the first region 221 may also be less than the length D2 of the second slit 212 within the second region 222. The length D3 of the second slit 212 within the first region 221 may also be greater than the length D4 of the second slit 212 within the second region 222. For example, as shown in FIG. 6, compared to FIG. 2, the order in which the first region 221 and the second region 222 are alternately arranged in FIG. 2 are reversed in FIG. 6.

Figure 7:
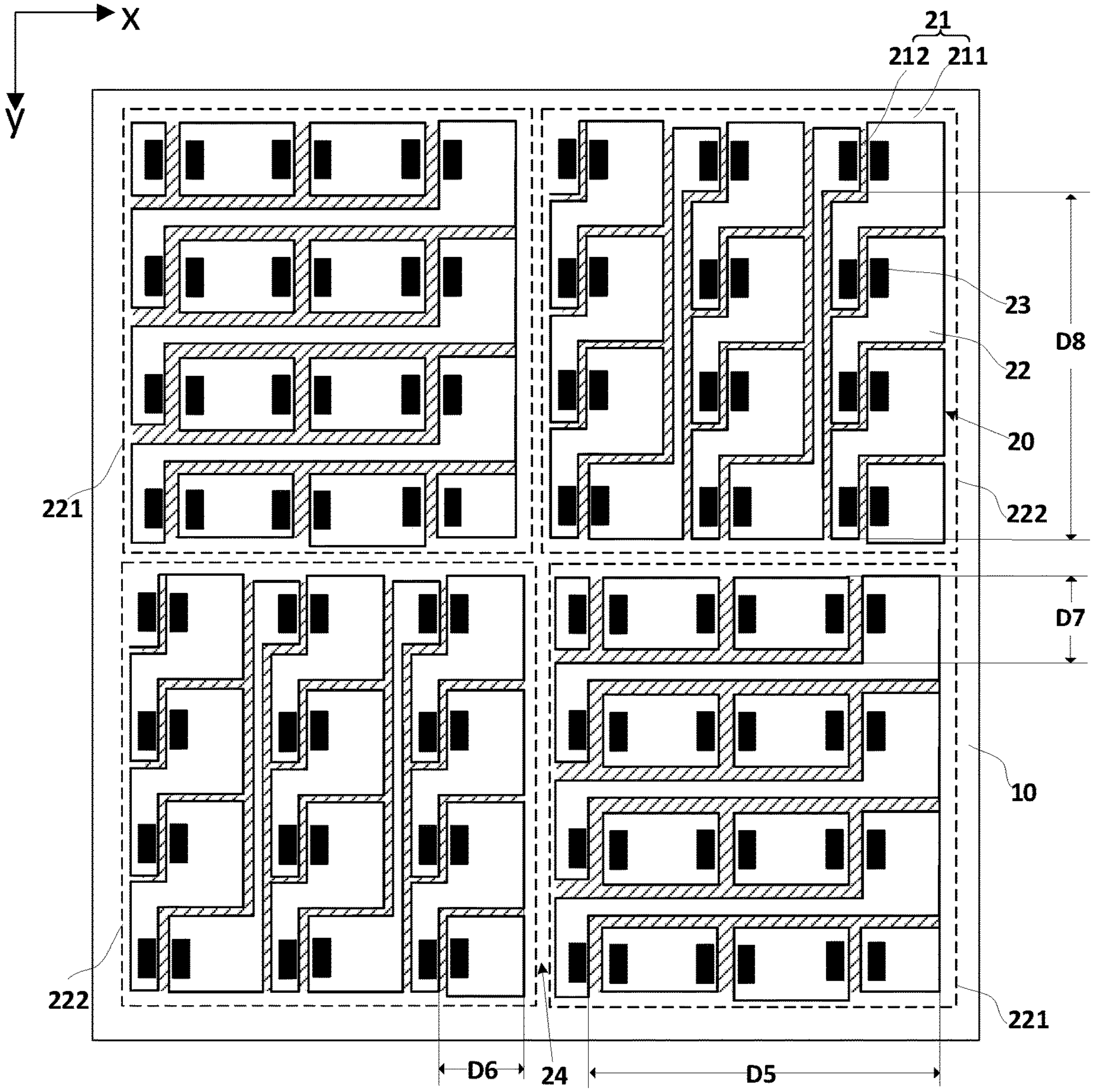
FIG. 7 is a top view III of the front surface of the circuit board according to the embodiment of the present application.

It can be understood that in the embodiment, the row direction and the column direction are opposing concepts. For example, if the circuit board shown in FIG. 2 is rotated to obtain FIG. 7, the rows in FIG. 2 become the columns in FIG. 7, and the columns in FIG. 2 become the rows in FIG. 7. That is, in other embodiments, when the column direction in FIG. 2 is rotated to become the row direction in FIG. 7, then in FIG. 7, the length D5 of the second slit 212 within the first region 221 along the same row direction X (corresponding to D1 in FIG. 2) is greater than the length D6 of the second slit 212 within the second region 222 along the same row direction X (corresponding to D2 in FIG. 2). Along the same column direction Y, the length D7 of the second slit 212 within the first region 221 (corresponding to D3 in FIG. 2) is less than the length D8 of the second slit 212 within the second region 222 (corresponding to D4 in FIG. 2).

In the embodiment, as shown in FIGS. 2 and 3, in the same column direction Y, due to the interruption of the second slit 212 within the second region 222 by the second extension portion A2 of the metal sheets 22 in the second region 222 along the row direction, the number of the second slits 212 extending along the column direction Y within the first region 221 is less than the number of the second slits 212 extending along the column direction Y within the second region 222. In the example shown in FIG. 2, in the same column direction Y (taking the first column from left to right as an example), the number of the second slits 212 within the first region 221 (as indicated by K1 in FIG. 2) is 1, while the number of the second slits 212 within the second region 222 (as indicated by K2, K3, K4 in FIG. 2) is 3.

In the embodiment, as shown in FIG. 2, the second slits 212 within the first region 221 and the second region 222 comprise several main slits and several branch slits, wherein the main slits extend in a straight line along the row direction X or column direction Y, and the branch slits separate the solder pads 23 between the adjacent metal sheets 22 and are connected to the main slits, with one main slit connected to at least two branch slits. The extension directions of the main slits within the first region 221 are not parallel to the extension directions of the main slits within the second region 222. Specifically, as shown in FIG. 2, the first region 221 has 6 main slits that extend along the column direction Y, denoted respectively as Z11, Z12, Z13, Z14, Z15, and Z16, each main slit is connected to 3 branch slits on one side. For example, the main slit Z16 is connected to 3 branch slits x11, x12, and x13, with each branch slit having at least a portion perpendicular to the main slit. While the second region 222 has 4 main slits that extend along the row direction X, denoted respectively as Z21, Z22, Z23, and Z24, each main slit is connected to 3 branch slits on one side. For example, the main slit Z24 is connected to 3 branch slits x21, x22, and x23, with each branch slit having a portion parallel to the main slit and a portion perpendicular to the main slit. Turning angles are formed at the junction of the portions parallel and perpendicular to the main slit. As can be seen from FIG. 2, the extension directions of the main slits within the first region 221 are perpendicular to the extension directions of the main slits within the second region 222. This design provides more supporting points in the extension direction of the main slits between the first region 221 and the second region 222, reducing the sinking degree of the steel stencil during the solder paste printing process on the circuit board, and extending the service life of the steel stencil.

In the embodiment, for example, as shown in FIG. 2, a supporting region 24 is provided between the adjacent first region 221 and second region 222. When the squeegee moves on the steel stencil, as the squeegee passes through the region between the adjacent first region 221 and second region 222, it applies a downward force perpendicular to the substrate 10 on the steel stencil. The supporting region 24 can provide support to the steel stencil, thereby reducing the degree of sinking and deformation of the steel stencil in the region between the adjacent first region 221 and second region 222. This further prevents damage to the steel stencil, thereby extending the service life of the steel stencil.

In the embodiment, for a single first region 221, the first slit 211 is positioned at the edge of the first region 221, while the second slit 212 is positioned within the first region 221. The first slit 211 and the second slit 212 are interconnected to enclose the first region 221. The first slit 211 isolates the first region 221 from external circuits outside the first region 221, while the second slit 212 isolates two adjacent metal sheets within the first region 221. For a single second region 222, the first slit 211 is positioned at the edge of the second region 222, and the second slit 212 is positioned within the second region 222. The first slit 211 and the second slit 212 are interconnected to enclose the second region 222. The first slit 211 isolates the second region 222 from external circuits outside the second region 222, while the second slit 212 isolates two adjacent metal sheets within the second region 222.

In the embodiment, the width of the second slit 212 positioned within the first region 221 and the second region 222 can be determined based on the spacing between the pins of electronic devices soldered to the adjacent solder pads 23 and the dimensions of the metal sheets 22. The width of the first slit 211 positioned at the edges of the first region 221 and the second region 222 is set according to practical requirements, such as voltage and current on the circuit board. In the embodiment, the width of the first slit 211 is less than the width of the second slit 212. By forming the first slit 211 at the edges of the first region 221 and the second region 222, the lines within the first region 221 and the second region 222 can be isolated from external circuits outside the first region 221 and the second region 222. By forming the second slit 212 within the first region 221 and the second region 222, adjacent metal sheets can be isolated from each other, thereby forming the required circuit. Additionally, the orientation and width of the first slit 211 and the second slit 212 can be designed reasonably in accordance with the circuit requirements, thereby maximizing the utilization of the support provided by the metal layer 20, and achieving the purpose of further reduction of the sinking degree of the steel stencil.

In some examples of the embodiment, at least one of the first slit 211 and the second slit 212 shown in FIG. 2 extends in the same direction as the row direction and column direction of the solder pad array, which may also be understood as the same direction as the X direction and Y direction as shown in FIG. 2. In the example shown in FIG. 2, the second slit 212 extends in a meandering manner. For example, the second slit 212 extends in a meandering manner along the row direction X and the column direction Y, and the second slit 212 forms a right angle at the corner of the extending path (although a rounded angle or other type of angle may also be used). By causing the second slit 212 to extend in a meandering manner along the row direction X and the column direction Y, multiple metal sheets 22 or the combination of the multiple metal sheets 22 can form a rectangular shape, making it easier to design the layout of electronic components during the packaging process.

It can be understood that in other embodiments, the second slit 212 may also extend in a meandering manner along other directions to divide the metal layer 20 into metal sheets of different shapes, such as circular, trapezoidal, rhomboidal, triangular, etc., to accommodate different shapes or sizes of electronic components.

For another example, in the example shown in FIG. 2, the first slit 211 also extends in a meandering manner. The first slit 211 extends in a meandering manner along the row direction X and the column direction Y to enclose multiple metal sheets 22 into rectangular first region 221 and second region 222, making it easier to design the layout of electronic components during the packaging process. It can be understood that in other embodiments, the first slit 211 may also extend in a meandering manner along other directions based on the extending path of the second slit 212, to enclose, together with the second slit 212, first region 221 and second region 222 of arbitrary shapes, such as circular, trapezoidal, rhomboidal, triangular, etc.

In some other examples of the embodiment, as shown in FIG. 3, the slit 21 (i.e., the first slit 211 and the second slit 212) is filled with a solder resist layer 30. In the direction perpendicular to the substrate 10, the height of the solder resist layer 30 is less than the height of the metal sheet 22. The solder resist layer 30 serves as insulation and solder mask. For example, in the embodiment, the material of the solder resist layer 30 is solder resist ink. In other embodiments, the solder resist layer 30 may also be made of solder resist paste, solder resist adhesive, and so on. During the circuit board packaging process, it is required to tin-plate the solder pads 23 to fix electronic components on the solder pads 23, and the spacing between adjacent solder pads 23 is small. Therefore, by filling the slit 21 with the solder resist layer 30 to isolate different metal sheets 22, it can prevent the occurrence of solder bridges between adjacent solder pads 23 that could cause different electronic components to affect each other. Furthermore, during the reflow soldering process, the solder resist layer 30 also serves to prevent the soldering tin from overflowing and avoid short-circuit of the circuit. In addition, the arrangement of the solder resist layer 30 ensures that even if the steel stencil deforms or sinks at the position of the first slit 211 and the second slit 212, its maximum extent of sinking can only be against the solder resist layer 30. Compared to a structure without the arrangement of the solder resist layer 30 at the first slit 211 and the second slit 212, this design can further reduce the sinking degree of the steel stencil, extending the service life of the steel stencil.

Figure 4:
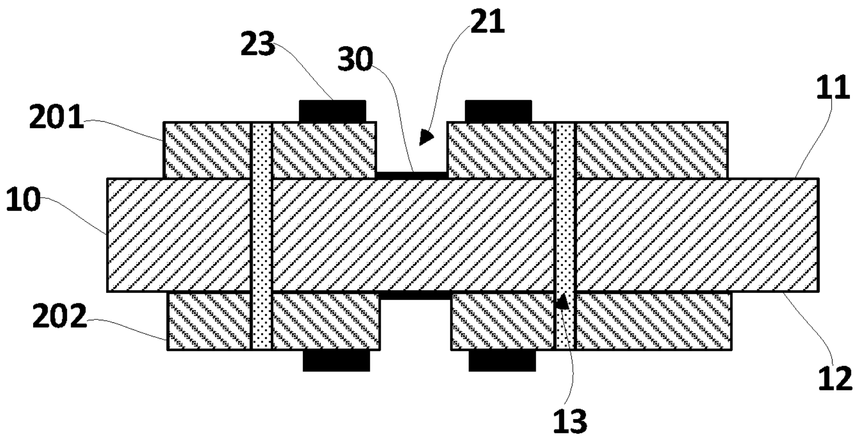
FIG. 4 is a cross-sectional schematic diagram II of the circuit board according to the embodiment of the present application.

In yet another example of the embodiment, both the front surface and the back surface of the substrate are provided with metal layers, and the metal layers on the front surface and the back surface may have a structure as the metal layer 20 shown in FIG. 2, or only one of them may have a structure as the metal layer 20 shown in FIG. 2. For example, referring to FIG. 4 (FIG. 4 also shows a cross-sectional schematic diagram of a portion including two adjacent metal sheets), the front surface of the substrate 10 is the first surface 11, and the back surface of the substrate 10 is the second surface 12. It should be understood that the front surface and back surface of the substrate 10 are relative terms. The first surface 11 is provided with the first metal layer 201, and the second surface 12 is provided with the second metal layer 202. Both the opposed first surface 11 and second surface 12 of the substrate 10 can be provided with circuits and have electronic components mounted. The metal layer structure of at least one of the first metal layer 201 and the second metal layer 202 is the same as the structure of the metal layer 20 shown in FIG. 2. For example, when the structure of the first metal layer 201 and the second metal layer 202 is the same as the structure of the metal layer 20 shown in FIG. 2, during the solder printing process on the circuit board, the purpose of reducing steel stencil sinking on both the front surface and the back surface can be achieved. It should be understood that the metal layer structure of at least one of the first metal layer 201 and the second metal layer 202 being the same as the structure of the metal layer 20 specifically includes: Only the structure of the first metal layer 201 is the same as the structure of the metal layer 20 according to the embodiment of the present application, or only the structure of the second metal layer 202 is the same as the structure of the metal layer 20 according to the embodiments of the present application, or the structures of both the first metal layer 201 and the second metal layer 202 are the same as the structure of the metal layer 20 according to the embodiments of the present application. In the example, there may be no circuit connection between the first metal layer 201 and the second metal layer 202, or a circuit connection may be made according to requirements. For example, referring to the example shown in FIG. 4, a via hole 13 is formed on the substrate 10, and the via hole 13 extends through the first surface 11 and the second surface 12 of the substrate 10. The first metal layer 201 and the second metal layer 202 are connected through the via hole 13 (i.e., the metal layers on the front surface and the back surface of the substrate 10 are electrically connected through the via hole 13). It should be understood that there are many ways to connect the circuits on the first metal layer 201 and the second metal layer 202 by using the via hole 13, for example, by chemical plating followed by electroplating to make the circuits on both sides of the via hole 13 conductive, or by threading a wire through the via hole 13 to connect the circuits on both sides of the via hole 13, or by filling the via hole 13 with a conductive substance that is in contact with both the first metal layer 201 and the second metal layer 202 to achieve conductivity. The conductive substance comprises conductive paste, conductive ink, soldering tin, and so on. By forming a via hole 3 on the substrate 10 to connect the circuits on the first metal layer 201 and the second metal layer 202, it can achieve the purposes of simplifying the circuit structure, avoiding wire winding, saving space, and so on.

In other examples of the embodiment, the circuit board comprises at least two substrates provided in a stacked manner, each of the substrates being provided with a metal layer. That is, in the example, the circuit board can be of a multi-layer circuit board structure with at least two substrates and metal layers provided on the substrates. It should be understood that in the example, the metal layers provided on each of the substrates can all have the structure as the metal layer 20 shown in FIG. 2, or some of the metal layers can have the structure as the metal layer 20 shown in FIG. 2, while the other metal layers have other structures.

In the example, when the circuit board comprises at least two stacked substrates, adjacent substrates can be bonded together by, but not limited to, an adhesive layer. Such a bonding method is simple and reliable. It should be understood that in the example, there may be no direct electrical connection between the metal layers on each of the substrates. Or according to the requirements, at least some of the metal layers between substrates can be electrically connected. Electrical connections can be achieved by, but are not limited to, forming corresponding via holes on the substrates or providing connecting lines on the surface of the substrates or outside the substrates, which is not limited in the example.

Figure 5:
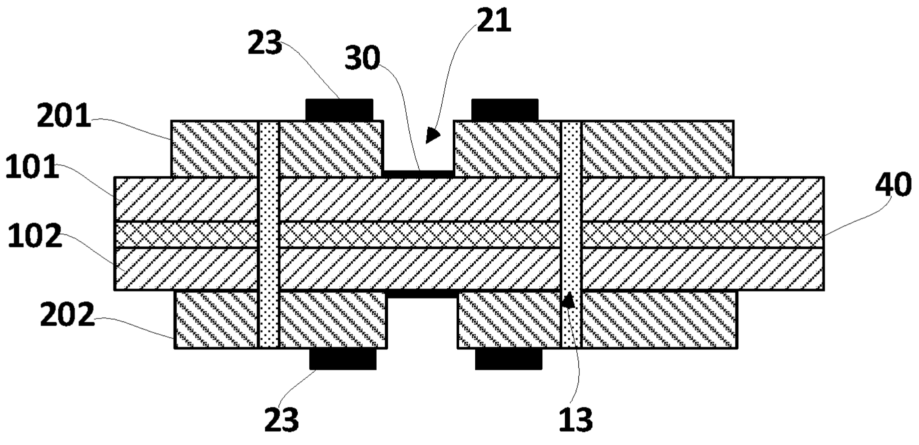
FIG. 5 is a cross-sectional schematic diagram III of the circuit board according to the embodiment of the present application.

To facilitate the understanding, the example will give an illustration below with reference to a multi-layer circuit board structure shown in FIG. 5 (FIG. 5 also shows a cross-sectional schematic diagram of a portion including two adjacent metal sheets). The multi-layer circuit board structure comprises two substrates 10, here referred to as the first substrate 101 and the second substrate 102. The first substrate 101 and the second substrate 102 are bonded together by an adhesive layer 40. The first substrate 101 is provided with a first metal layer 201 and a solder pad 23 to form a first sub-circuit board, and the second substrate 102 is provided with a second metal layer 202 and a solder pad 23 to form a second sub-circuit board. At least one of the first metal layer 201 and the second metal layer 202 has the structure as the metal layer 20 shown in FIG. 2. That is, the circuit board shown in FIG. 5 comprises two substrates 10 and an adhesive layer 40 that bonds the two substrates 10 together, with both of the two substrates 10 being provided with metal layers shown in FIG. 2 on the side away from the adhesive layer 40. The circuit board shown in FIG. 5 further comprises a via hole 13 that extends at least through the first substrate 101, the adhesive layer 4, and the second substrate 102, and the via hole 13 electrically connects the first metal layer 201 and the second metal layer 202.

It should be understood that when there is a high demand for the multifunctionality of electronic products, a greater number of wiring layers are required. By using a circuit board structure composed of at least two substrates 10 and at least two metal layers 20, interference in signal transmissions between different lines in multi-layer wiring structures can be avoided. Additionally, by employing the circuit board according to the embodiment of the present application for a multi-layer circuit board, it helps to reduce production costs during the steel stencil printing process. Additionally, it can be understood that in other examples, the quantity of substrates 10 and metal layers 20 can be in various combinations, which are not limited herein.

An electronic device is provided according to the embodiment of the present application. The electronic device comprises electronic components and the circuit board as described above. The electronic components are provided on the circuit board and soldered to the corresponding solder pads, for example, electronic components can be directly soldered to the solder pads 23. In the embodiment, the electronic components can be at least one of capacitors, resistors, and LED chips. The electronic components comprise positive and negative pins. After using a steel stencil to print solder paste on the solder pads 23, the positive and negative pins of the electronic components are soldered to the solder pads 23 through solder paste (or alternatively fixed to the solder pads through conductive adhesive). By employing the circuit board according to the embodiment of the present application, the distribution of the second slits on the circuit board can reduce the extent of deformation of the steel stencil at the positions of the second slits during the solder printing process. This therefore best avoids damage to the steel stencil due to the excessive extent of sinking at the positions of the second slits, thus ensuring the precision of the solder printed by the steel stencil, enhancing the reliability and yield of the circuit board and electronic device, and saving production costs for the electronic device.

Figure 8:
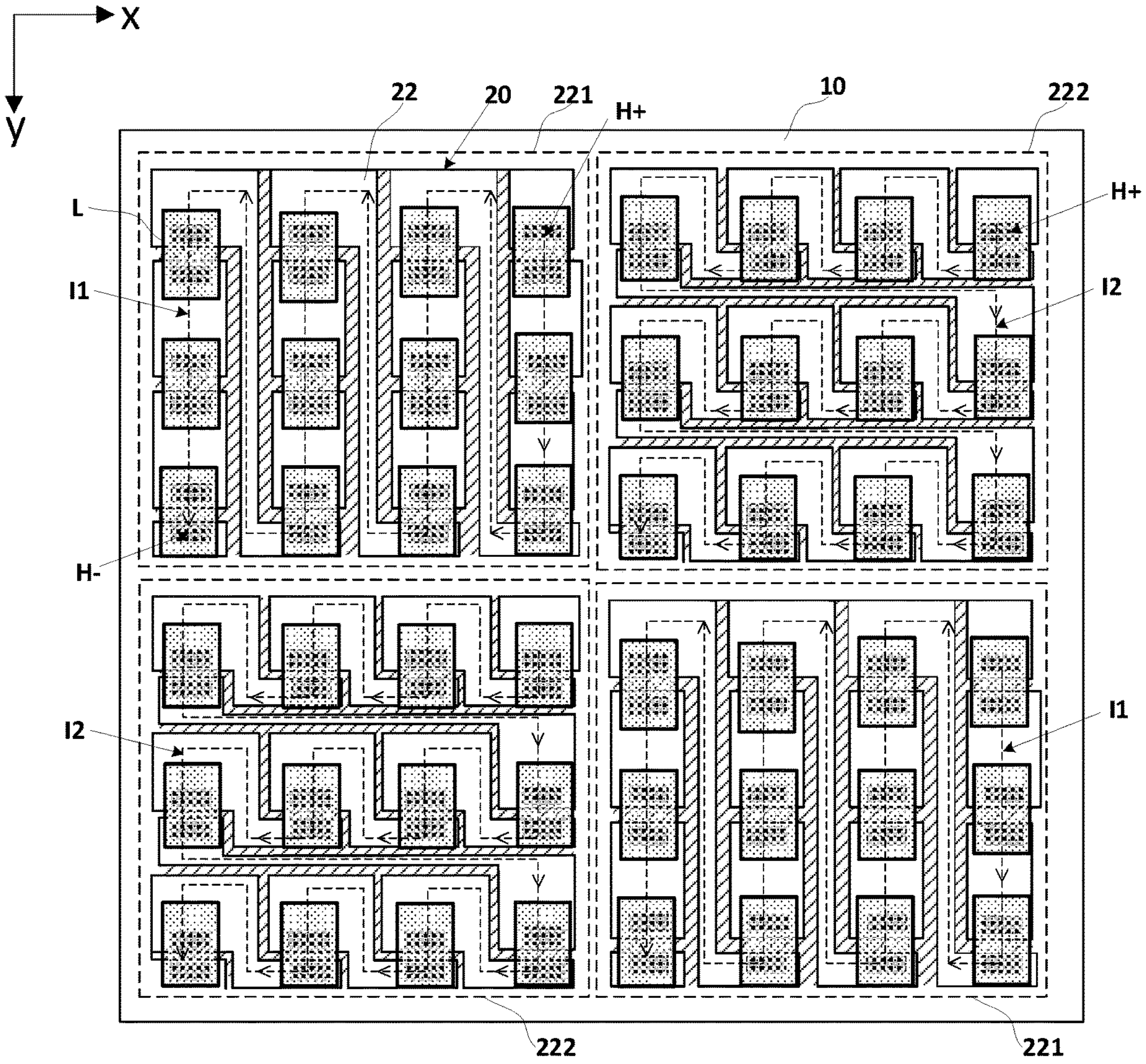
FIG. 8 is a top view of the circuit board provided with an LED chip according to the embodiment of the present application.

The circuit board according to the embodiment can be used for a display screen of an electronic device as a circuit board of a backlight source of the display screen. In this application scenario, the solder pads in each first region and second region on the circuit board can be used for soldering LED chips, and all the LED chips in each first region and second region are connected in series. LED chips within one first region form an LED chip array, and LED chips within one second region also form an LED chip array. All LED chips in the first region and the second region together form a large LED chip array on the substrate. To facilitate the understanding, the illustration below considers soldering LED chips on the circuit board shown in FIG. 2. As shown in FIG. 8, LED chips L are soldered onto the solder pads 23 in each first region 221 and second region 222 of the circuit board. As shown in FIG. 8, for the LED chip array composed of LED chips L in the first region 221, the upper-right solder pad is the positive solder pad H+, and the lower-left solder pad is the negative solder pad H−. Each LED chip L in the first region 221 is connected to form a series circuit through the metal sheets 22 within the first region 221, wherein the direction of current flow in this series circuit is indicated by the dashed line I1 in FIG. 8. For the LED chip array composed of LED chips L in the second region 222, the upper-right solder pad is the positive solder pad H+, and the lower-left solder pad is the negative solder pad H− (not labeled in the figure). Each LED chip L in the second region 222 is connected to form a series circuit through the metal sheets 22 within the second region 222, wherein the direction of current flow in this series circuit is indicated by the dashed line I2 in FIG. 8.

In the example shown in FIG. 2, the circuit board is provided with at least two alternately arranged first regions 221 and second regions 222 both horizontally and vertically, dividing the display screen into at least two sub-regions. Therefore, LED chips within the same region (for example, within a particular first region 221 or a particular second region 222) can be controlled simultaneously, and LED chips within the same region as a whole can be controlled individually, i.e. individually controlling the brightness of LED chips in a specific region. This achieves localized dimming, improving the display effect of the display screen.

The above disclosure is only to illustrate the preferred embodiments of the present application, and should not be taken as limiting the scope of the claims of the present application. Those of ordinary skill in the art can understand how to implement all or part of the processes of the embodiments described above and make equivalent changes within the scope of the claims of the present application.

Such modifications and variations are still considered to be within the scope of the present application.

What is claimed is:

1. A circuit board, comprising at least one substrate, and a metal layer provided on a front surface and/or a back surface of the substrate, wherein the metal layer is provided with a region array, the region array comprises at least two first regions and at least two second regions formed by division through a first slit, and the first regions and the second regions are alternately distributed and mutually insulated in both a row direction and a column direction of the region array;

each of the first regions and the second regions is provided with at least two mutually insulated metal sheets formed by division through a second slit, and the two adjacent metal sheets within each of the first regions and the second regions are correspondingly provided with solder pads for connecting with an electronic component; the solder pads within each of the first regions and the second regions are arranged in a multi-row and multi-column array on the substrate to form a solder pad array;

at least a portion of the metal sheets within each of the first regions are provided with a first extension portion that extends along a column direction of the solder pad array, and in each row direction of the solder pad array within each of the first regions, the second slit is interrupted by the first extension portion; at least a portion of the metal sheets within each of the second regions are provided with a second extension portion that extends along a row direction of the solder pad array, and in each column direction of the solder pad array within each of the second regions, the second slit is interrupted by the second extension portion;

wherein a width of the first slit is less than a width of the second slit.

2. The circuit board according to claim 1, wherein an extension direction of the first slit and/or the second slit is the same as the row direction and the column direction of the solder pad array.

3. The circuit board according to claim 1, wherein a number of the solder pads within the first regions and the second regions is equal.

4. The circuit board according to claim 1, wherein the first slit and/or the second slit extends in a meandering manner.

5. The circuit board according to claim 1, wherein the first slit and the second slit are filled with a solder resist layer, and in a direction perpendicular to the substrate, a height of the solder resist layer is less than a height of the metal sheet.

6. The circuit board according to claim 1, wherein both the front surface and the back surface of the substrate are provided with the metal layers.

7. The circuit board according to claim 6, wherein a via hole that extends through the front surface and the back surface of the substrate is formed on the substrate to electrically connect the metal layers on the front surface and the back surface.

8. The circuit board according to claim 1, comprising at least two of the substrates provided in a stacked manner, each of the substrates being provided with the metal layer.

9. The circuit board according to claim 8, comprising two of the substrates and an adhesive layer that bonds the two substrates together, both of the two substrates being provided with the metal layers on a side away from the adhesive layer.

10. The circuit board according to claim 9, further comprising a via hole that extends through the two substrates and the adhesive layer, the metal layers on the two substrates being electrically connected through the via hole.

11. The circuit board according to claim 1, wherein a supporting region is provided between the adjacent first region and second region.

12. The circuit board according to claim 1, wherein the second slits within the first regions and the second regions comprise main slits and branch slits, wherein the main slits extend along the row direction or the column direction of the solder pad array, and the branch slits separate the solder pads between the adjacent metal sheets and are connected to the main slits, with one main slit connected to a plurality of the branch slits; extension directions of the main slits within the first regions are perpendicular to extension directions of the main slits within the second regions.

13. An electronic device, comprising electronic components and a circuit board, the circuit board comprising at least one substrate, and a metal layer provided on a front surface and/or a back surface of the substrate, wherein the metal layer is provided with a region array, the region array comprises at least two first regions and at least two second regions formed by division through a first slit, and the first regions and the second regions are alternately distributed and mutually insulated in both a row direction and a column direction of the region array;

each of the first regions and the second regions is provided with at least two mutually insulated metal sheets formed by division through a second slit, and the two adjacent metal sheets within each of the first regions and the second regions are correspondingly provided with solder pads for connecting with an electronic component; the solder pads within each of the first regions and the second regions are arranged in a multi-row and multi-column array on the substrate to form a solder pad array;

at least a portion of the metal sheets within each of the first regions are provided with a first extension portion that extends along a column direction of the solder pad array, and in each row direction of the solder pad array within each of the first regions, the second slit is interrupted by the first extension portion; at least a portion of the metal sheets within each of the second regions are provided with a second extension portion that extends along a row direction of the solder pad array, and in each column direction of the solder pad array within each of the second regions, the second slit is interrupted by the second extension portion;

wherein the electronic components are provided on the circuit board and soldered to the corresponding solder pads.

14. The electronic device according to claim 13, wherein the electronic components comprise LED chips.

15. A circuit board, comprising at least one substrate, and a metal layer provided on a front surface and/or a back surface of the substrate, wherein the metal layer is provided with a region array, the region array comprises at least two first regions and at least two second regions formed by division through a first slit, and the first regions and the second regions are alternately distributed and mutually insulated in both a row direction and a column direction of the region array;

each of the first regions and the second regions is provided with at least two mutually insulated metal sheets formed by division through a second slit, and the two adjacent metal sheets within each of the first regions and the second regions are correspondingly provided with solder pads for connecting with an electronic component; the solder pads within each of the first regions and the second regions are arranged in a multi-row and multi-column array on the substrate to form a solder pad array;

at least a portion of the metal sheets within each of the first regions are provided with a first extension portion that extends along a column direction of the solder pad array, and in each row direction of the solder pad array within each of the first regions, the second slit is interrupted by the first extension portion; at least a portion of the metal sheets within each of the second regions are provided with a second extension portion that extends along a row direction of the solder pad array, and in each column direction of the solder pad array within each of the second regions, the second slit is interrupted by the second extension portion;

wherein the second slits within the first regions and the second regions comprise main slits and branch slits, wherein the main slits extend along the row direction or the column direction of the solder pad array, and the branch slits separate the solder pads between the adjacent metal sheets and are connected to the main slits, with one main slit connected to a plurality of the branch slits; extension directions of the main slits within the first regions are perpendicular to extension directions of the main slits within the second regions.

* * * * *